(12) United States Patent
Feldotte et al.

(10) Patent No.: US 9,024,797 B2
(45) Date of Patent: May 5, 2015

(54) INTEGRATING A/D CONVERTER

(71) Applicant: Sartorius Lab Instruments GmbH & Co. KG, Goettingen (DE)

(72) Inventors: Heinrich Feldotte, Goettingen (DE); Heyko Holst, Goettingen (DE)

(73) Assignee: Sartorius Lab Instruments GmbH & Co. KG, Goettingen (DE)

( * ) Notice: Subject to any disclaimer, the term of this patent is extended or adjusted under 35 U.S.C. 154(b) by 0 days.

(21) Appl. No.: 14/486,129

(22) Filed: Sep. 15, 2014

(65) Prior Publication Data

US 2015/0002327 A1    Jan. 1, 2015

Related U.S. Application Data

(63) Continuation of application No. PCT/EP2013/000443, filed on Feb. 15, 2013.

(30) Foreign Application Priority Data

Mar. 13, 2012   (DE) .................. 10 2012 102 081

(51) Int. Cl.
*H03M 1/34* (2006.01)
*H03M 1/00* (2006.01)
*G01R 19/00* (2006.01)
*H03M 1/12* (2006.01)

(52) U.S. Cl.
CPC ........... *H03M 1/002* (2013.01); *G01R 19/0084* (2013.01); *H03M 1/12* (2013.01)

(58) Field of Classification Search
CPC ......... H03M 1/12; H03M 1/002; H03M 1/00; H03M 2201/3168; H03M 2201/847
USPC .......................................... 341/158, 155, 154
See application file for complete search history.

(56) References Cited

U.S. PATENT DOCUMENTS 3,964,061 A * 6/1976 Aiken ............................ 341/165
4,271,392 A * 6/1981 Outram et al. ................ 324/115

* cited by examiner

*Primary Examiner* — Jean B Jeanglaude

(57) ABSTRACT

In an integrating A/D converter, first and second reference voltage inputs (18, 20) alternatingly connect through a reference voltage switch (16, 16') via a first reference resistor ($R_{ref}$) to an inverting input (122) of an integrator (12). A comparator (22) connected downstream of the integrator (12) compares a test voltage applied to its test voltage input (221) with a comparator reference voltage applied to its reference voltage input (222). This input (221) is connected to the output (126) of the integrator (12). A control device (40) actuates the first reference voltage switch (16, 16') in a pulsed manner and measures the time intervals between the individual switching processes. An inverter (24) inverting a measuring voltage ($U_M$) and a first heating resistor ($R_{MH}$) coupled thermally with a measuring resistor ($R_M$), are connected in series between the measuring voltage input (14) and the output of the first reference voltage switch (16, 16').

4 Claims, 2 Drawing Sheets

INTEGRATING A/D CONVERTER

CROSS-REFERENCE TO RELATED APPLICATIONS

This is a Continuation of International Application PCT/EP2013/000443, with an international filing date of Feb. 15, 2013, which in turn claims priority to German Patent Application 10 2012 102 081.7, filed Mar.13, 2012. The entire disclosures of both these related applications are incorporated into the present application by reference.

FIELD OF AND BACKGROUND OF THE INVENTION

The invention relates to an integrating A/D converter, comprising
 a measuring voltage input for an analog measuring voltage that is to be digitized, which is connected via a measuring resistor to the inverting input of an integrator,
 a first reference voltage input for a first reference voltage and a second reference voltage input for a second reference voltage,
 a first reference voltage switch configured to alternatively connect the first and the second reference voltage inputs via a first reference resistor to the inverting input of the integrator,
 a comparator connected downstream of the integrator and configured to compare a test voltage applied to the comparator test voltage input thereof with a comparator reference voltage applied to the comparator reference voltage input thereof, wherein the comparator test voltage input is connected to the output of the integrator, and
 a control device which is configured to actuate the first reference voltage switch in a clocked manner and to measure time intervals between individual switching processes.

Analog-to-digital converters of this type (commonly referred to in the art as A/D converters) which serve to convert an analog measuring voltage into a digital signal are well known. A circuit diagram showing the principle of an A/D converter 10 of this type is shown in FIG. 1. The "heart" of the A/D converter 10 is the integrator 12, which comprises an operational amplifier with an inverting input 122, a non-inverting input 123 and an output 124, as well as a capacitor 125 which is connected between the inverting input 122 and the output 124 of the operational amplifier 122. The non-inverting input 123 of the operational amplifier 121 is connected to a reference voltage, particularly to ground. The inverting input 122 is connected via the measuring resistor $R_M$ to the measuring voltage input 14 to which the measuring voltage $U_M$ to is applied during operation. Furthermore, the inverting input 122 is connected via a reference resistor $R_{ref}$ to the reference voltage switch 16 which, depending on the switch setting, electrically connects either the first reference voltage input 18 or the second reference voltage input 20. A reference voltage $U_{ref1}$ or $U_{ref2}$ is applied to the reference voltage inputs 18, 20, respectively, which inputs typically can have mutually inverted polarity and the same or different voltage values.

Particularly in the case of monopolar measuring voltages $U_M$, one of the reference voltages can also be zero, i.e. the corresponding reference voltage input is open or connected to ground. The integrator output 126 is connected to the test voltage input 221 of a comparator 22, the reference voltage input 222 of which is connected to a comparator reference voltage, which e.g. can be ground. The comparator 22 outputs a signal or a signal change at its output 223 in each case, when the test voltage applied to the test voltage input 221 corresponds to the reference voltage applied to the reference voltage input 222. The comparator output signal is fed back as the switching signal, via a control device 40, to the reference voltage switch 16.

An A/D converter of this type operates as follows: In a first phase of a measuring clock cycle T, the reference voltage switch 16 is switched such that the first reference voltage input 18 is connected. During this phase, the integrator integrates the sum of the measuring current $I_M$, which results from the drop in the measuring voltage $U_M$ to across the measuring resistor $R_M$, and the reference current $I_{ref1}$, which results from the drop in the first reference voltage $U_{ref1}$ across the reference resistor $R_{ref}$. After a time t1 pre-defined by the control device 40, the reference voltage switch 16 switches over, so that the first reference voltage input 18 is disconnected and the second reference voltage input 20 is connected. Now the integrator deintegrates the sum of the measuring current $I_M$ and the reference current $I_{ref2}$, which results from the drop in the second reference voltage $U_{ref2}$ across the reference resistor $R_{ref}$.

In this example, the polarities of the measuring voltage $U_M$ and the first reference voltage $U_{ref1}$ are opposite and the polarities of the measuring voltage $U_M$ and the second reference voltage $U_{ref2}$ are the same. The integrated or deintegrated voltage respectively lies at the integrator output 126 and therefore at the test voltage input 221 of the comparator 22. This second, or deintegration, phase has a duration $\tau$. As soon as the integrator voltage is fully deintegrated, a comparator signal is output which is used by the control device 40 to switch over the reference voltage switch 16 once more and to begin a new measuring clock cycle. Furthermore, the control device 40, which during the preceding measuring clock cycle T has measured the durations of the two measuring clock cycle phases $t1=T-\tau$ and $\tau$ and, in particular, has calculated the ratio of the duration of the second measuring phase $\tau$ to the overall duration T of the preceding measuring clock cycle, i.e. the duty factor $\delta=\tau/T$, can output a corresponding numerical value which is a measure of the measuring voltage $U_M$ applied during the measuring clock cycle.

From DE 28 21 146 B2, there is known an integrating A/D converter wherein the reference voltage is configured as a voltage partially overlaid with the input voltage making use of an inverting amplifier.

From U.S. Pat. No. 4,270,119, there is known an integrating A/D converter wherein, in the reference branch, an inverted reference voltage is overlaid.

From GB 2 120 481 A, there is known an integrating A/D converter wherein a sensor calibration or linearization is undertaken by connecting a resistor between the input voltage and the reference voltage.

A disadvantage of the known A/D converters is the non-linear dependency of the power loss on the duty factor $\delta$ and thus on the size of the measuring voltage, i.e. on the measured value itself. In particular, the power loss can be calculated as a function of the duty factor $\delta$ as follows $$P = \delta^2 R_M (I_{ref1}^2 + I^2 r_{ref2} + 2 I_{ref1} I_{ref2}) - \\ \delta [R_M (I_{ref2}^2 + 2 I_{ref1} I_{ref2}) + R_{ref}(I_{ref2}^2 - I_{ref1}^2)] + \\ R_M (I_{ref2}^2 + 2 I_{ref1} I_{ref2}) + R_{ref} I_{ref2}^2$$

For many precision measurements, such a non-linear dependency of the A/D converter on the variable to be digitized is not acceptable. An example is the precision weighing devices which operate according to the force compensation principle wherein the measuring voltage $U_M$ applied to the measuring voltage input 14 is proportional to the force that acts on a weighing sensor. Measuring value-dependent power losses in the A/D converter lead to measuring value-dependent heating which, in turn, exerts an influence on temperature-sensitive elements of the electronics with the consequence that systematic measuring value-dependent measuring errors can arise.

OBJECTS AND SUMMARY OF THE INVENTION

It is an object of the present invention to develop further an A/D converter of this type such that the dependency of its power loss on the measuring value is substantially reduced.

This object is achieved, in the context of an integrating A/D converter as recited above, in that an inverter inverting the measuring voltage and a first heating resistor $R_{MH}$ which is coupled thermally to the measuring resistor $R_M$ are provided such that they are connected in series between the measuring voltage input and the output of the reference voltage switch.

An important aspect of the invention is the provision of an additional heating resistor $R_{MH}$ which absorbs as the power loss exactly the difference of the power loss absorbed by the measuring resistor $R_M$ from a constant overall power loss. In other words, the total of the power losses which together are absorbed by the heating resistor $R_{MH}$ and by the measuring resistor $R_M$ is always the same and independent of the measuring value. Consequently, the heat input remains constant, independent of the measuring value. This applies at least following a transient phase in which the thermal equilibrium is reached. The resistance value of the reference resistor $R_{ref}$ is preferably equal to the resistance value of the measuring resistor $R_M$.

The functional capability of the invention is especially evident if the values of the reference voltages $U_{ref1}$ and $U_{ref2}$ are equal and their polarities are opposite to one another. That is to say, the same reference current then flows through the reference resistor $R_{ref}$ in each case, regardless of the switching state of the reference voltage switch. In cases in which different reference voltage values are to be applied, additional measures are required in order to keep the total power loss of the A/D converter constant. In a development of the invention, it is therefore provided that a second reference voltage switch is provided which is clocked opposite to the first reference voltage switch and by which the first and second reference voltage input can be connected, as alternatives to one another, to ground via a second heating resistor $R_{refH}$ which is thermally coupled to the reference resistor $R_{ref}$ and the measuring resistor $R_M$. This means that, in each case, the reference voltage which is not applied to the reference resistor $R_{ref}$ drops across the second heating resistor $R_{refH}$ and generates a corresponding additional power loss. However, in order to ensure that the total power loss absorbed by the measuring resistor $R_M$, the first heating resistor $R_{MH}$, the reference resistor $R_{ref}$ and the second heating resistor $R_{refH}$ is constant independent of the measuring value, then as provided in a preferred embodiment, the resistance value of the second heating resistor $R_{ref}$ is to be dimensioned exactly half the size of the resistance value of the first heating resistor $R_{MH}$. Although in an embodiment of this type, the total power loss is greater than the power loss in an A/D converter of the design as described above, in contrast thereto, it allows the use of reference voltages having different values.

The basic operational method for an A/D converter according to the invention corresponds without restriction to the operational method as described above for A/D converters according to the prior art.

Further features and advantages of the invention are disclosed in the following description and the drawings.

DETAILED DESCRIPTION OF EXEMPLARY EMBODIMENTS

Figure 1:
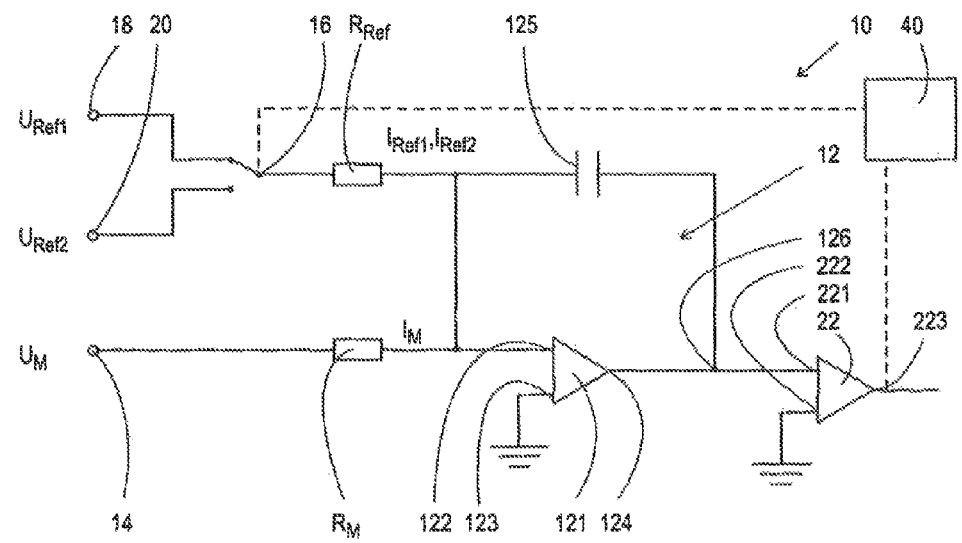
FIG. 1: an equivalent circuit diagram of an A/D converter according to the prior art.
Figure 2:
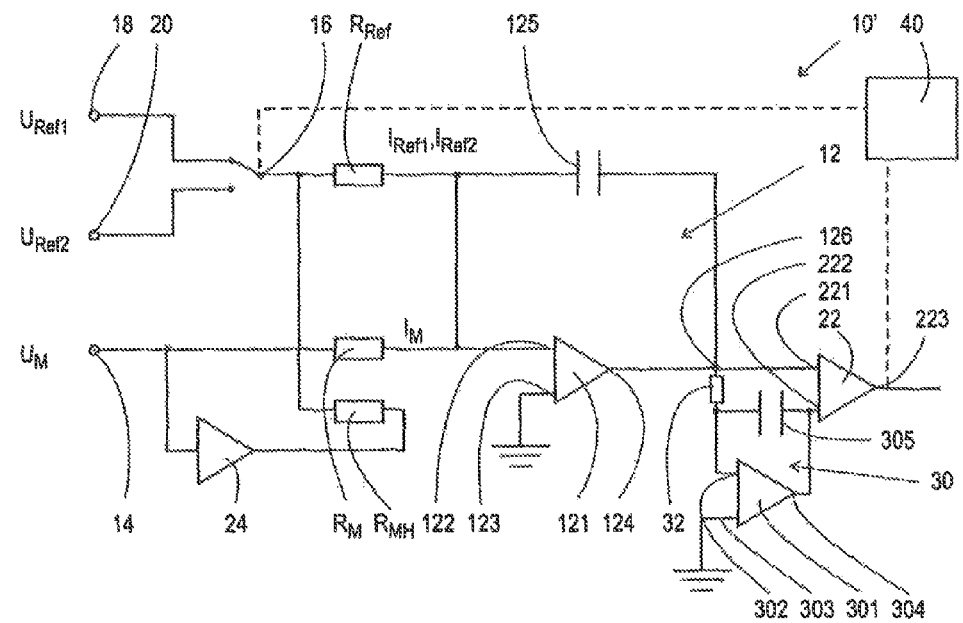
FIG. 2: an equivalent circuit diagram of a first embodiment of an A/D converter according to the invention.
Figure 3:
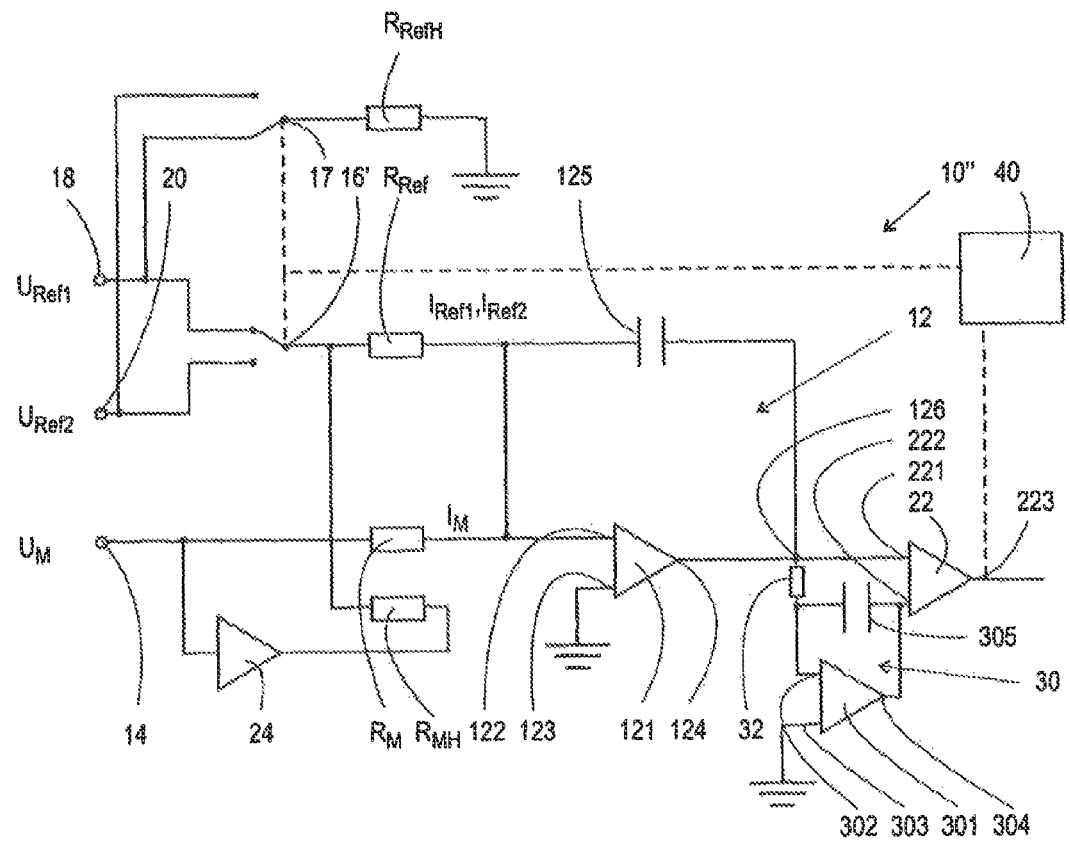
FIG. 3: an equivalent circuit diagram of a second embodiment of an A/D converter according to the invention.
Figure 4:
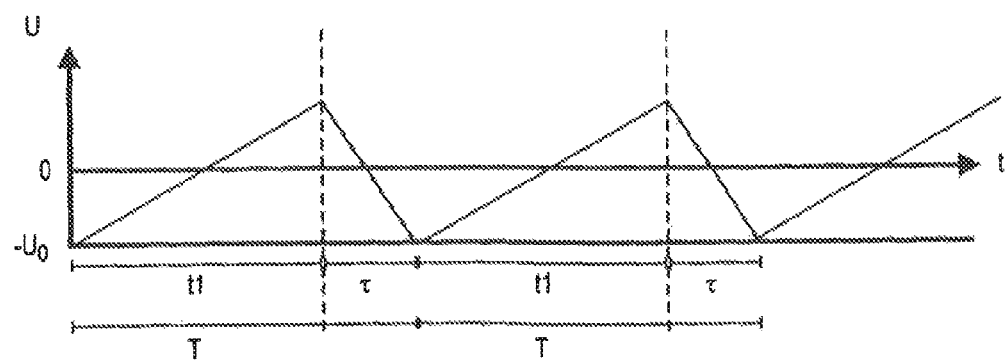
FIG. 4: a schematic graphical representation of the voltage pattern at the integrator output of the A/D converter according to FIGS. 2 and 3.

FIG. 1 shows an A/D converter according to the prior art, which has already been described in detail in the introduction. FIGS. 2 and 3 show advantageous embodiments of an A/D converter according to the invention, wherein the same reference signs refer to the same or similar parts in all the drawings. FIG. 4 shows a diagram of the variation over time of the integrator output voltage, as generated by each of the A/D converters of FIGS. 1 to 3, i.e. both in an A/D converter according to the prior art and in an A/D converter according to the invention. The A/D converter according to the invention will now be described essentially by explaining its differences from the A/D converter of FIG. 1.

The A/D converter 10' of FIG. 2 differs in two aspects from the A/D converter 10 of FIG. 1. According to the invention, its measuring voltage input 14 is connected via an inverter 24, i.e. via a voltage amplifier with a gain of "−1," and the heating resistor $R_{MH}$ is connected to the output of the reference voltage switch 16. The resistance value of the heating resistor $R_{MH}$ is equal to the resistance value of the measuring resistor $R_M$. Similarly, the resistance value of the reference resistor $R_{ref}$ is equal to the resistance value of the measuring resistor $R_M$. The resulting power loss constant of the A/D converter according to FIG. 2 can be set out mathematically as follows:

Averaged over one measuring clock cycle T, the following applies $$I_M T + I_{ref1}\tau + I_{ref2}(T-\tau) = 0$$

The total power loss arising at the measuring, heating and reference resistors $R_M$, $R_{MH}$ and $R_{ref}$ can be written as $$P = \frac{U_M^2}{R_M} + \frac{U_{ref2}^2}{R_{ref}}(1-\delta) + \frac{U_{ref1}^2}{R_{ref}}\delta +$$
$$\frac{(-U_M - U_{ref2})^2}{R_{MH}}(1-\delta) + \frac{(-U_M - U_{ref1})^2}{R_{MH}}\delta$$

where $$R_M = R_{ref}; R_{MH} = R_M |U_{ref1}| = |U_{ref2}|$$

and use of the above equation for the measuring current $I_M$ and rearranging using Ohm's law, all the dependencies of δ fall away so that the power loss is independent of the duty factor and therefore independent of the measurement value.

The second respect in which the A/D converter 10' of FIG. 2 differs from the A/D converter 10 of FIG. 1 is the configuration of the comparator reference voltage applied at the reference voltage input 222 of the comparator 22. Whereas in the A/D converter 10 of FIG. 1, only ground is applied here, in the case of the A/D converter 10' of FIG. 2, the output of an additional integrator 30 is connected to the comparator reference voltage input 222. The additional integrator 30 comprises an operational amplifier 301 with an inverting input 302, a non-inverting input 303 and an output 304. Whereas the non-inverting input 303 is connected to ground, the inverting input 302 is connected via a capacitor 305 to the output 304. The input of the integrator 30 is connected, via an input resistor 32, to the output 126 of the integrator 12. The mode of operation of the additional integrator 30 lies therein that it averages and inverts the output signal of the integrator 12 and makes this averaged signal available to the comparator 22 as the comparator reference voltage. In other words, in the comparator 22, the output signal of the integrator 12 is no longer compared with ground, but with its own mean value. Therefore, a voltage signal with no DC component is applied at the capacitor 125 of the integrator 12. The DC voltage-related faults of the capacitor 125, such as leakage currents and dielectric absorption, are hereby prevented or at least reduced. Thus it is possible, without any sacrifice of functionality in the integrator 12, to use less high quality capacitor types as the capacitor 125, and this results in a significant reduction in cost for the circuit and/or an improvement in measuring quality. There are no disadvantages associated with the power loss constant of the A/D converter according to the invention since the power loss absorbed by the input resistor 32 of the additional integrator 30 is independent of the duty factor.

As has been described, in order to achieve the power loss constant according to the invention in an A/D converter according to FIG. 2, the reference voltages $U_{ref1}$ and $U_{ref2}$ must have the same value. If this restriction is not desirable for any reason and if nevertheless the power loss constant according to the invention is to be maintained, extension of the circuit as shown in FIG. 3 is required. In the A/D converter 10'' of FIG. 3, in parallel with the first reference voltage switch 16', a second reference voltage switch 17 is provided, which is connected in contrary manner to the first reference voltage switch 16', i.e. it connects the respective other reference voltage input to the respective switch output. The respective reference voltage not dropping across the reference resistor $R_{ref}$ therefore drops across the second heating resistor $R_{refH}$. The functioning of this embodiment can be mathematically described as follows:

The measuring current $I_M$ over one measuring clock cycle can be written as:

$$I_M T + I_{ref1} \tau + I_{ref2}(T-\tau) = 0$$

The power loss occurring in the measuring resistor $R_M$, reference resistor $R_{ref}$, the first heating resistor $R_{MH}$ and the second heating resistor $R_{refH}$ can thus be described as follows:

$$P = \frac{U_M^2}{R_M} + \frac{U_{ref2}^2}{R_{ref}}(1-\delta) + \frac{U_{ref1}^2}{R_{ref}}\delta + \frac{U_{ref2}^2}{R_{refH}}\delta +$$

$$\frac{U_{ref1}^2}{R_{refH}}(1-\delta) + \frac{(-U_M - U_{ref2})^2}{R_{MH}}(1-\delta) + \frac{(-U_M - U_{ref1})^2}{R_{MH}}\delta$$

where $$R_M = R_{ref}; \quad R_{MH} = R_M; \quad R_{refH} = \frac{1}{2}R_{MH}$$

The use of the above formula for the measuring current $I_M$ and re-arranging using Ohm's law enables all the dependencies of the duty factor $\delta$ to fall away, so that here also the total power loss is independent of the measurement value. However, the (constant) total value of the power loss is higher than in the A/D converter 10' of FIG. 2, specifically by the power loss incurred by the additional heating resistor $R_{refH}$.

As FIG. 3 shows, this embodiment can also be extended by an additional integrator on the reference input 222 of the comparator 22 in order to prevent DC-related effects at the capacitor 125. For explanation, reference is made to the description above relating to FIG. 2.

FIG. 4 shows schematically the voltage variation across the capacitor 125 of the integrator 12, as it arises in the A/D converter according to the invention of FIGS. 2 and 3. During a first phase t1 of a switching cycle, during which the reference voltage switch 16 or 16' contacts the first reference voltage $U_{ref1}$, via the capacitor 125, a resulting voltage is integrated from the sum of the measuring current $I_M$ and the first reference current $I_{ref1}$. The duration of this first phase t1 is pre-determined by the control device 40 and is the same in every measuring clock cycle. A second measuring clock cycle phase $\tau$ begins with the switching over of the reference voltage switch 16 or 16', so that the voltage across the capacitor 125 is deintegrated according to the sum of the rectified currents $I_M$ and $I_{ref2}$. The second measuring phase $\tau$ is ended by a signal from the comparator 22 which is issued as soon as the comparator input voltage, i.e. the voltage applied across the capacitor 125 is equal to the comparator reference voltage. The overall duration T of the measuring clock cycle corresponds to the total of t1+$\tau$. The comparator reference voltage is typically, e.g. even in the A/D converter of FIG. 1, equal to zero. However, in the embodiments of FIGS. 2 and 3, the comparator reference voltage is different from zero. In particular, it is offset through the additional integrator 30 by the mean value of the voltage applied across the capacitor 125 during the preceding measuring clock cycle, particularly offset "downward" due to the inverting effect of the additional integrator 30.

In other words, the voltage across the capacitor 125 oscillates about zero, which corresponds to an alternating voltage without a DC component. In this way, DC voltage-dependent capacitor effects are prevented.

The embodiments covered by the description and shown in the figures are merely illustrative exemplary embodiments of the present invention. A broad spectrum of possible variations will be evident to a person skilled in the art, based on the present disclosure. In particular, the specific dimensions of the individual components and the choice of the clocking may be adapted by the skilled person in accordance with the requirements of each individual case.

REFERENCE LIST

10, 10', 10'' A/D converter
12 Integrator
121 Operational amplifier of 12
122 Inverting input of 121
123 Non-inverting input of 121
124 Output of 121
125 Capacitor of 12

126 Output of 12
14 Measuring voltage input
16, 16' Reference voltage switch
17 Second reference voltage switch
18 First reference voltage input
20 Second reference voltage input
22 Comparator
221 Test voltage input of 22
222 Reference voltage input of 22
223 Output of 22
24 Inverter
30 Additional integrator
301 Operational amplifier of 30
302 Inverting input of 301
303 Non-inverting input of 301
304 Output of 301
305 Capacitor of 30
32 Input resistor before 30
$R_M$ Measuring resistor
$R_{MH}$ First heating resistor
$R_{ref}$ Reference resistor
$R_{refH}$ Second heating resistor
$U_M$ Measuring voltage
$I_M$ Measuring current
$U_{ref1}$ First reference voltage
$I_{ref1}$ First reference current
$U_{ref2}$ Second reference voltage
$I_{ref2}$ Second reference current
T Duration of measuring clock cycle
t1 Duration of integration phase
τ Duration of deintegration phase

The invention claimed is:

1. An integrating analog-to-digital (A/D) converter, comprising:
   a measuring voltage input for an analog measuring voltage, which is connected via a measuring resistor to an inverting input of an integrator,
   a first reference voltage input for a first reference voltage and a second reference voltage input for a second reference voltage,
   a first reference voltage switch configured to alternatively connect the first and the second reference voltage inputs via a first reference resistor to the inverting input of the integrator,
   a comparator connected downstream of the integrator and configured to compare a test voltage applied to a test voltage input of the comparator with a comparator reference voltage applied to a reference voltage input of the comparator, wherein the comparator test voltage input is connected to an output of the integrator,
   a control device configured to actuate the first reference voltage switch in a clocked manner and to measure time intervals between individual switching processes, and
   an inverter configured to invert the measuring voltage and a first heating resistor thermally coupled to the measuring resistor, wherein the inverter and the heating resistor are connected in series between the measuring voltage input and the output of the first reference voltage switch.

2. The integrating A/D converter according to claim 1, wherein:
   a resistance value of the first reference resistor is equal to a resistance value of the measuring resistor.

3. The integrating A/D converter as claimed in claim 1, further comprising:
   a second reference voltage switch clocked opposite to the first reference voltage switch and configured to alternatively connect the first and second reference voltage inputs to ground via a second heating resistor thermally coupled to the reference resistor and the measuring resistor.

4. The integrating A/D converter according to claim 3, wherein:
   a resistance value of the second heating resistor s is half a resistance value of the first heating resistor.

\* \* \* \* \*